United States Patent [19]

Bertsch et al.

[11] Patent Number: 4,878,852

[45] Date of Patent: Nov. 7, 1989

[54] CIRCUIT TESTER CONSTRUCTION

[75] Inventors: Jack E. Bertsch, Orchard Park; Harold P. Kopp, Williamsville, both of N.Y.

[73] Assignee: Polytronics, Inc., Buffalo, N.Y.

[21] Appl. No.: 202,114

[22] Filed: Jun. 3, 1988

[51] Int. Cl.[4] .............................................. H01R 4/66
[52] U.S. Cl. .................................. 439/103; 324/72.5; 439/620
[58] Field of Search ................. 324/133, 508, 72.5; 439/103, 102, 104, 106, 166, 170, 171, 172, 174, 48, 489, 490, 504, 506, 620

[56] References Cited

U.S. PATENT DOCUMENTS

| | | | |
|---|---|---|---|
| 2,323,736 | 7/1943 | Tousley | 173/361 |
| 3,025,486 | 3/1962 | Falconer | 439/172 X |
| 3,685,000 | 8/1972 | Robbins | 439/103 |
| 3,733,576 | 5/1973 | Cooper | 439/103 |
| 4,105,968 | 8/1978 | Mobley et al. | 324/508 X |
| 4,280,092 | 7/1981 | Wells, Jr. et al. | 324/508 |

Primary Examiner—Eugene F. Desmond
Attorney, Agent, or Firm—Joseph P. Gastel

[57] ABSTRACT

A ground pin construction for an electrical device having a housing and prongs for insertion into an electrical socket, the housing including a boss having a bore therein for guiding the ground pin between extended and retracted positions, a flexible member attached to the ground pin and movable by a button which protrudes through the housing, cam surfaces on the housing which cause the elongated flexible member to ride over them as the ground pin is being moved to an extended position, and interengaging shoulders between the flexible member and the housing for retaining the ground pin in an extended position after the flexible member rides over the cam structure, the flexible member being deflectable by depressing on the button so that the flexible member can be disengaged from the shoulder on the housing and the ground pin can be moved to a retracted position by pushing on the button. A support structure for a printed circuit within the housing of an electrical device including support members within the housing for firmly mounting the printed circuit, an elongated lead between the printed circuit and the movable ground pin described above, and a protective cover separating the elongated lead from sharp points on the printed circuit so that the elongated lead will not be abraded during its movement back and forth with the ground pin.

19 Claims, 3 Drawing Sheets

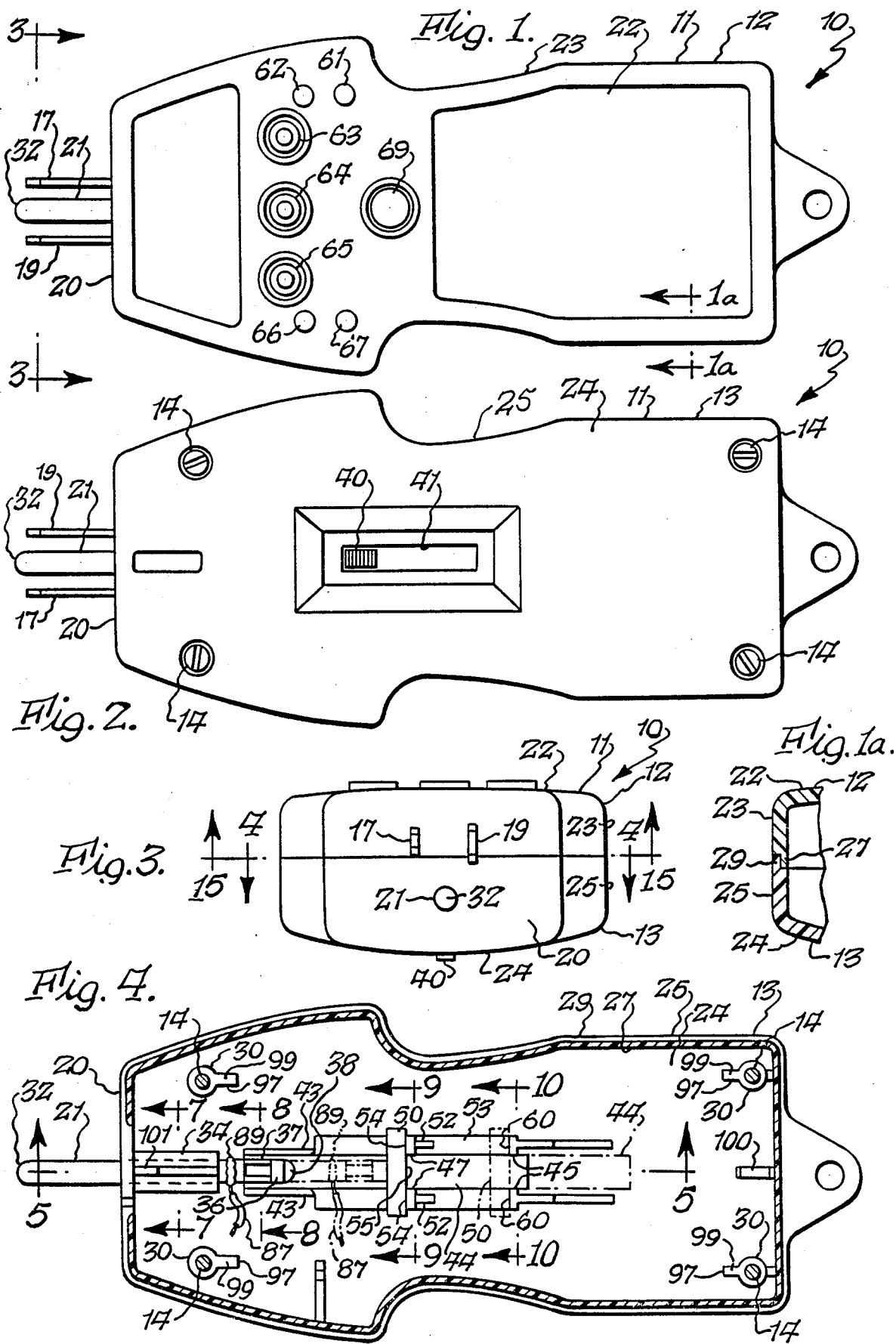

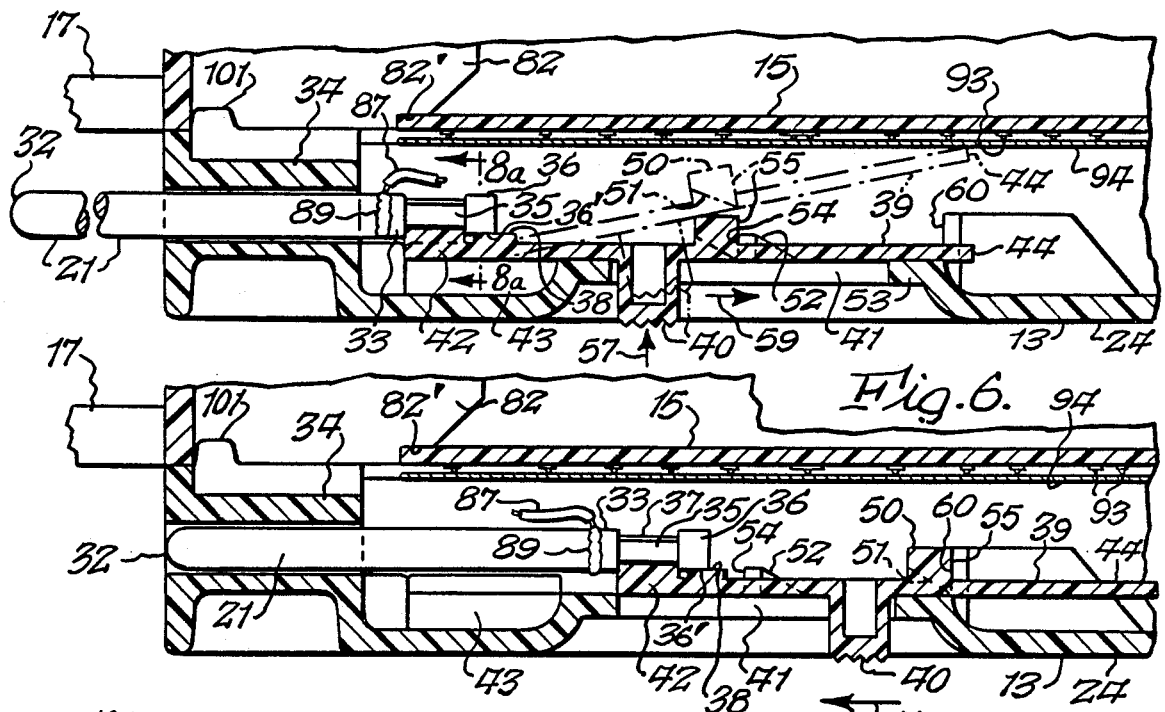
Fig. 5.
Fig. 6.
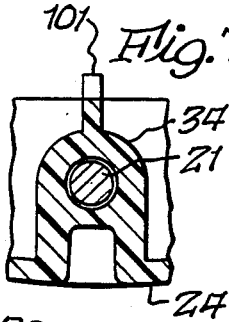
Fig. 7. Fig. 8. Fig. 9. Fig. 10.
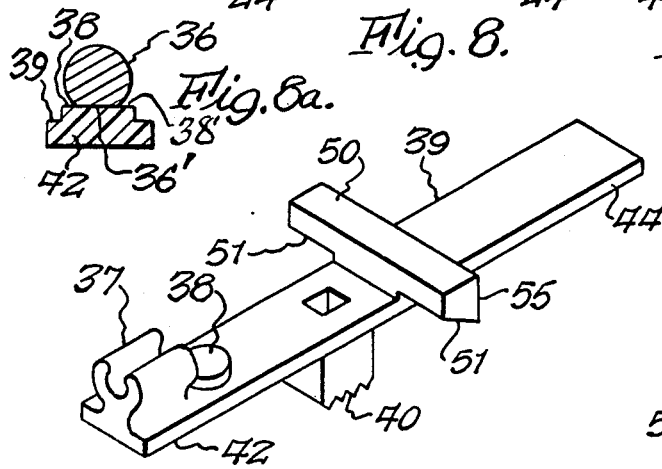
Fig. 8a.
Fig. 11.
Fig. 12.
Fig. 13.
Fig. 14.

CIRCUIT TESTER CONSTRUCTION

BACKGROUND OF THE INVENTION

The present invention relates to an improved circuit tester construction and more particularly to an extensible ground pin and related structure.

By way of background, there are in existence the old type of electrical outlets for receiving only two prongs of an electrical lead, and there are also in existence receptacles which in addition receive a ground pin. The electrical circuit tester of the present invention is intended to measure the various characteristics of the electrical wiring leading to the electrical outlet. The circuitry and its intended functions are completely disclosed in pending U.S. patent application Ser. No. 936,684, filed Nov. 26, 1986. The present subject matter is directed to structure for permitting the circuit tester to be used with conventional two prong outlets and also for those which have a socket for additionally receiving a ground pin.

SUMMARY OF THE INVENTION

It is accordingly one object of the present invention to provide an improved retractable ground pin construction for an electrical device so that it can be used with both two-prong outlets as well as those having a socket for a ground pin.

It is another object of the present invention to provide an electrical device having a retractable ground pin uniquely associated with a printed circuit forming a part of the electrical device. Other objects and attendant advantages of the present invention will readily be perceived hereafter.

The present invention relates to a retractable ground pin construction for an electrical device having a housing and prong means for insertion into an electrical socket, the retractable ground pin construction comprising an elongated ground pin having an inner end and having an outer end for movement between retracted and extended positions relative to said housing, means on said housing for rectilinearly guiding said ground pin for movement between said extended and retracted positions relative to said housing, an elongated member in said housing, first and second ends on said elongated member, means securing said first end of said elongated member to said inner end of said ground pin, interengaging means for selectively connecting said elongated member to said housing to fixedly secure said ground pin in said extended position, and manually actuatable means secured to said elongated member and extending through said housing to the outside thereof for effecting movement of said elongated member and said ground pin secured thereto in a rectilinear direction to said extended position wherein said interengaging means fixedly secure said ground pin in said extended position and for disengaging said interengaging means to effect movement of said elongated member and said ground pin connected thereto to said retracted position.

The present invention also relates to an electrical device with a retractable ground pin comprising a housing divided longitudinally into first and second housing portions having first and second walls, respectively, support means in said housing for supporting a printed circuit board thereon in spaced relationship to said first wall, prong means mounted on said housing, lead means connecting said circuit board to said prong means, a ground pin having an inner end and having an outer end for movement between retracted and extended positions relative to said housing, means in said second housing portion for rectilinearly guiding said ground pin for movement between extended and retracted positions relative to said housing, an elongated member in said second housing portion, first and second ends on said elongated member, means securing said first end of said elongated member to said inner end of said ground pin, interengaging means for selectively connecting said elongated member to said second wall to fixedly secure said ground pin in said extended position, and manually actuatable means secured to said elongated member and extending through said second wall to the outside thereof for effecting movement of said elongated member and said ground pin secured thereto in a rectilinear direction to said extended position wherein said interengaging means fixedly secure said ground pin in said extended position and for disengaging said interengaging means to effect movement of said elongated member and said ground pin connected thereto to said retracted position.

The present invention also relates to an electrical device comprising a housing having first and second spaced walls, a printed circuit board, means mounting said printed circuit board in said housing relative to said first side to define a space therebetween, prong means mounted on said housing and extending outwardly therefrom for insertion into an electrical outlet, means electrically coupling said prong means to said circuit board, a ground pin, means mounting said ground pin in said space for movement between an extended position for insertion into said electrical outlet with said prong means and a retracted position wherein it is not inserted into said electrical outlet with said prong means, an elongated lead having end portions and a central portion, said end portions of said elongated lead being attached to said circuit board and said ground pin and said central portion lying in said space, said elongated lead being of a sufficient length so as to maintain said coupling relationship between said circuit board and said ground pin in both said retracted and extended positions of said ground pin, and shield means located between said circuit board and said elongated lead means to shield said central portion of said elongated lead means from engaging said printed circuit board.

The various aspects of the present invention will be more fully understood when the following portions of the specification are read in conjunction with the accompanying drawings wherein:

BRIEF DESCRIPTION OF THE DRAWINGS

FIG. 1 is a top plan view of the improved circuit tester structure of the present invention;

FIG. 1a is a fragmentary cross sectional view taken substantially along line 1a—1a of FIG. 1;

FIG. 2 is a bottom plan view of the circuit tester;

FIG. 3 is an end elevational view taken substantially in the direction of arrows 3—3 of FIG. 1;

FIG. 4 is a cross sectional view taken substantially along line 4—4 of FIG. 3 and showing the retractable ground pin structure;

FIG. 5 is an enlarged fragmentary cross sectional view taken substantially along line 5—5 of FIG. 4 with the ground pin in an extended position;

FIG. 6 is a view similar to FIG. 5 but showing the ground pin in a retracted position;

FIG. 7 is a fragmentary cross sectional view taken substantially along line 7—7 of FIG. 4;

FIG. 8 is a fragmentary cross sectional view taken substantially along line 8—8 of FIG. 4;

FIG. 8a is a cross sectional view taken substantially along line 8a—8a of FIG. 5;

FIG. 9 is a fragmentary cross sectional view taken substantially along line 9—9 of FIG. 4;

FIG. 10 is a fragmentary cross sectional view taken substantially along line 10—10 of FIG. 4;

FIG. 11 is a fragmentary side elevational view showing the positions of the elongated member and the cam and shoulder means on the housing wall when the ground pin is in a retracted position;

FIG. 12 is a view similar to FIG. 11 but showing the elongated member engaging the cam during movement of the ground pin to an extended position;

FIG. 13 is a view similar to FIG. 12 but showing the elongated member after it has moved beyond the cam and is in engagement with the shoulder which holds the ground pin in an extended position;

FIG. 14 is a perspective view of the elongated member which moves the ground pin between extended and retracted positions;

DESCRIPTION OF THE PREFERRED EMBODIMENTS

Figure 15:
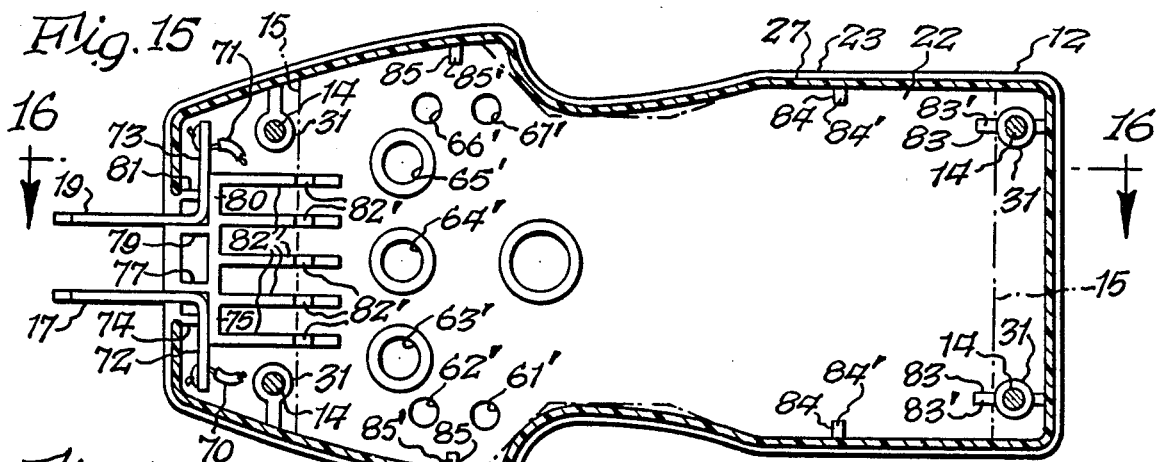
FIG. 15 is a cross sectional view taken substantially along line 15—15 of FIG. 3 but not showing parts within the housing.

The circuit tester 10 of the present invention includes a molded plastic housing 11 having two housing portions 12 and 13 which are suitably connected to each other by screws 14 and which mount therebetween a circuit board 15. Prongs 17 and 19 extend outwardly from the end 20 of the housing for insertion into an electrical outlet. A retractable ground pin 21 is also located at end wall 20. Ground pin 21 is retracted to permit prongs 17 and 19 to be inserted into electrical outlets which do not have a ground pin connection, and it is extended when the receptacle does have a ground pin connection. The circuit tester is for testing the condition of the electrical circuit leading to an electrical outlet.

The structural characteristics of housing portions 12 and 13 are as follows: Housing portion 12 includes a top wall 22 and a peripheral side wall 23 (FIG. 1a) extending substantially perpendicularly thereto around its entire extent in the configuration shown in FIG. 1. Housing portion 13 has a bottom wall 24 and a peripheral side wall 25 (FIG. 1a) extending substantially perpendicularly thereto throughout its extent (FIG. 4). Housing walls 23 and 25 are connected to each other by interfitting and abutting flanges 27 and 29, respectively (FIG. 1a). Screws 14 extend through integrally molded columns 30 in housing portion 13 and are threadably received in aligned columns 31 in housing portion 12 to thereby maintain housing portions 12 and 13 in assembled relationship.

In accordance with one aspect of the present invention, ground pin 21 is slidably mounted in housing portion 13 for movement between extended and retracted positions, thereby permitting the circuit tester to be used with electrical outlets which both have and do not have a ground pin connection. More specifically, ground pin 21 has an outer end 32 and an inner end 33. The central portion of ground pin 21 is slidably mounted in boss 34 molded integrally with wall 24. The inner end 33 of ground pin 21 has a reduced diameter portion 35 which is received within mating slotted cylindrical portion 37 (FIGS. 8 and 14) of elongated member 39 which is slidably mounted on wall 24. More specifically, elongated member 39 includes a thumb-receiving protuberance or button 40 which rides in slot 41 of wall 24 (FIGS. 2, 5, 6, 9 and 14). The forward end 42 of elongated member 39 is also guided for rectilinear movement by upstanding flanges 43 (FIG. 8). The rear end 44 of elongated member 39 is guided for rectilinear movement by flanges 45 (FIG. 10). The central portion of elongated member 39 is guided for rectilinear movement by flanges 47 (FIG. 9). Thus, by applying a person's thumb to thumb-receiving button 40 and moving it in the direction of arrow 49 (FIG. 6), ground pin 21 can be moved from the retracted position of FIG. 6 to the extended position of FIG. 5. The extreme inner end 36 of ground pin 21 has a flat 36' (FIG. 8a) on its underside which rides on the flat upper surface 38' of cylindrical boss 38 formed integrally with elongated member 39 to prevent ground pin 21 from rotating about its longitudinal axis, to thereby prevent winding of lead 87, described hereafter, around it.

Elongated member 39 is flexible resilient plastic, and it has integrally molded therewith a cross member 50 (FIG. 14) which has inclined surfaces 51 at its outer ends. Inclined cam members 52 are formed on raised portions 53 of housing wall 24, and thus, in the movement of elongated flexible member 39 from the position of FIG. 6 to the position of FIG. 5, as inclined surfaces 51 ride over cam surfaces 52, elongated flexible member 39 will deflect until it passes beyond shoulders 54 whereupon the elongated member 39 will spring back to the solid-line position of FIG. 5 with the rear surface 55 of cross member 50 abutting shoulders 54, thereby preventing ground pin 21 from retracting when it is forced into a mating socket of an electrical outlet. However, when it is desired to retract ground pin 21, the thumb is applied to button 40 in the direction of arrow 57 (FIG. 5) to deflect elongated member 39 to the dotted-line position shown in FIG. 5. Thereafter a force is applied in the direction of arrow 59 to move the elongated member 39 back to the position of FIG. 6 wherein surface 55 of cross member 50 abuts shoulders 60.

In FIG. 5 the dot-dash line position of elongated member 39 is shown in the position in which it assumes when it is being moved in the direction of arrow 57 prior to being moved in the direction of arrow 59 from its extended position to its retracted position. However, it will be appreciated that when it moves from the position of FIG. 6 to the position of FIG. 5, the inclined surfaces 51 merely ride over the cam surfaces 52 and the elongated member 39 does not necessarily deflect to the dot-dash position of FIG. 5. It merely deflects enough to ride over the cam surfaces and drop to the solid-line position shown in FIG. 5.

Figure 16:
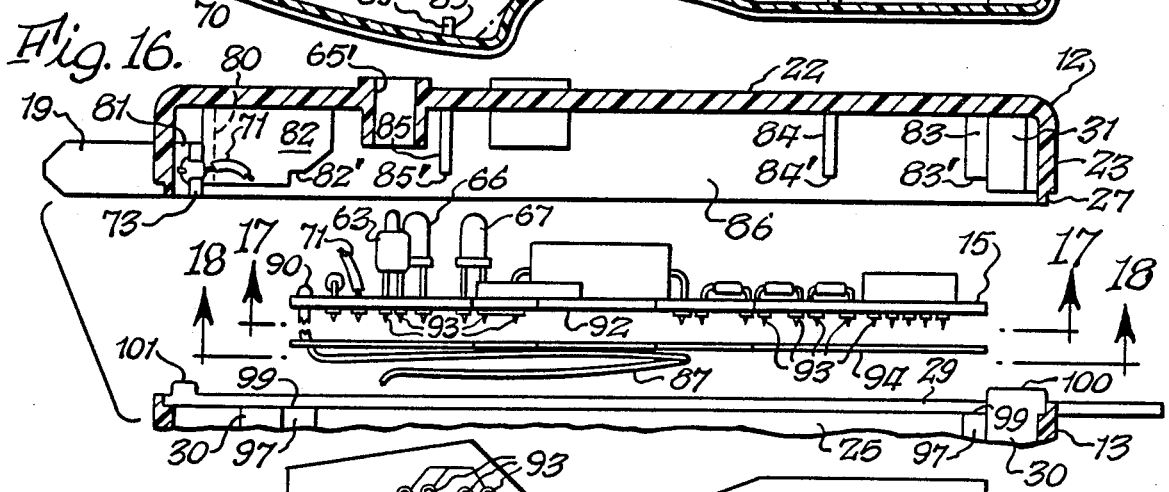
FIG. 16 is an exploded fragmentary cross sectional view taken substantially along line 16—16 of FIG. 15 and showing the two housing portions in spaced relationship to each other, the circuit board, and the protective cover for shielding the elongated lead connected to the ground pin from the sharp protrusions on the circuit board.

The circuit tester 10 includes a plurality of indicator lamps 61, 62, 63, 64, 65, 66 and 67 and a test button 69 which are suitably connected to printed circuit board 15 which is also electrically connected to prongs 17 and 19 by leads 70 and 71, respectively. Prongs 17 and 19 are held within housing portion 22 by their end portions 72 and 73, respectively, which are wedged between the flanges formed integrally with housing portion 22. More specifically, prong portion 72 is wedged between flanges 74, 75 and 77. Prong portion 73 is wedged between flange portions 79, 80 and 81. Flanges 80 and 75 are in line with each other and are formed integrally with a plurality of identical flanges 82 (FIGS. 15 and 16).

Circuit board 15 is mounted on housing portion 12 in the following manner. Flanges 83 are formed integrally with columns 31 (FIGS. 15 and 16). Flanges 84 and 85 are molded integrally with housing portion 12. The top surfaces 83', 84' and 85' of flanges 83, 84 and 85, respectively, lie in the same plane. In addition, the surfaces 82' of flanges 82 (FIGS. 15 and 16) also lie in the same plane as surfaces 83', 84' and 85'. The outer edge portions of circuit board 15 lie on surfaces 82', 83', 84' and 85' within housing portion 12. The various electrical components (not numbered) on the surface of circuit board 15 facing wall 22 lie within the space 86 defined by housing portion 12. Lamps 61, 62, 63, 64, 65, 66 and 67 extend through openings 61', 62', 63', 64', 65', 66' and 67' in housing portion 12.

Figure 17:
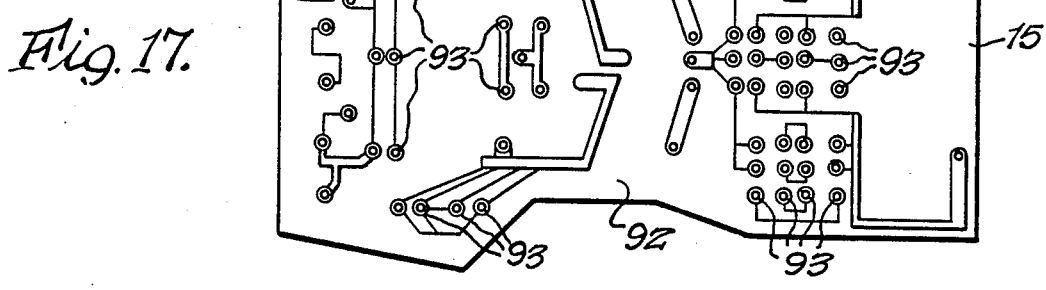
FIG. 17 is a view of the circuit board taken in the direction of arrows 17—17 of FIG. 16.
Figure 18:
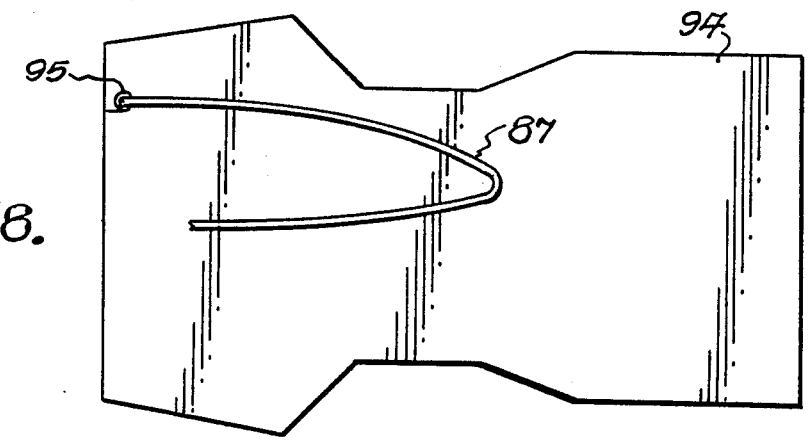
FIG. 18 is a view of the protective cover taken substantially in the direction of arrows 18—18 of FIG. 16.

An elongated flexible lead 87 has one end soldered to ground pin 21 at 89 (FIG. 4) and the other end soldered to the circuit board at 90 (FIG. 16) after extending through aperture 91 (FIG. 17) in the circuit board. The underside 92 of circuit board 15 has a plurality of sharp points 93 (not all numbered) where the soldered connections are made. As will be appreciated, lead 87 moves laterally relative to surface 92 as the ground pin 21 is retracted and extended. Accordingly, in order to protect flexible elongated lead 87 from abrasion by pointed projections 93, a protective paper cover sheet 94 is juxtaposed over the sharp projections 93, and lead 87 extends through an aperture 95 in sheet 94. Thus, as the elongated lead 87 moves back and forth, it will not be abraded by the sharp projections 93.

Flanges 97 (FIG. 4) which are molded integrally with columns 30 have upper surfaces 99 which bear against the outer edges of the protective cover 94 to hold it in position against the sharp projections 93. Keys 100 and 101 in housing portion 13 abut the inner surfaces of side wall 23 of housing portion 12 for alignment between the housing halves 12 and 13. Thus the circuit board 15 and protective cover 94 are firmly held between the surfaces 83', 84', 85' and 82', on one hand, and surfaces 99, on the other hand.

It can thus be seen that the improved circuit tester of the present invention is manifestly capable of achieving the above-enumerated objects, and while preferred embodiments of the present invention have been disclosed, it will be appreciated that it is not limited thereto but may be otherwise embodied within the scope of the following claims.

What is claimed is:

1. In an electrical device having a housing and prong means for insertion into an electrical socket, a retractable ground pin construction comprising an elongated ground pin having an inner end and having an outer end for movement between retracted and extended positions relative to said housing, means on said housing for rectilinearly guiding said ground pin for movement between said extended and extracted positions relative to said housing, an elongated member in said housing, first and second ends on said elongated member, means securing said first end of said elongated member to said inner end of said ground pin, interengaging means for interfitting with and selectively positively locking said elongated member to said housing to fixedly lock said ground pin in said extended position, and manually actuatable means secured to said elongated member and extending through said housing to the outside thereof for effecting movement of said elongated member and said ground pin secured thereto in a rectilinear direction to said extended position wherein said interengaging means fixedly lock said ground pin in said extended position and for moving said interengaging means out of said interfitting locking engagement with said housing and effecting movement of said elongated member and said ground pin connected thereto to said retracted position.

2. In an electrical device as set forth in claim 1 including means on said housing for guiding said elongated member for rectilinear movement in the same direction as said rectilinear movement of said ground pin.

3. In an electrical device as set forth in claim 2 wherein said last-mentioned means is a track.

4. In an electrical device having a housing and prong means for insertion into an electrical socket, a retractable ground pin construction comprising an elongated ground pin having an inner end and having an outer end for movement between retracted and extended positions relative to said housing, means on said housing for rectilinearly guiding said ground pin for movement between said extended and retracted positions relative to said housing, an elongated member in said housing, first and second ends on said elongated member, means securing said first end of said elongated member to said inner end of said ground pin, interengaging means for selectively connecting said elongated member to said housing to fixedly secure said ground pin in said extended position, and manually actuatable means secured to said elongated member and extending through said housing to the outside thereof for effecting movement of said elongated member and said ground pin secured thereto in a rectilinear direction to said extended position wherein said interengaging means fixedly secure said ground pin in said extended position and for disengaging said interengaging means to effect movement of said elongated member and said ground pin connected thereto to said retracted position, said interengaging means comprising shoulder means on said housing and abutment means on said elongated member.

5. In an electrical device as set forth in claim 4 wherein said abutment means comprise a cross-bar on said elongated member.

6. In an electrical device as set forth in claim 4 including cam means operatively located between said shoulder means and said abutment means for permitting said abutment means to pass beyond said shoulder means during movement of said ground pin from said retracted position to said extended position.

7. In an electrical device as set forth in claim 6 wherein said elongated member is flexible and resilient for biasing said abutment means toward said housing to thereby permit said abutment means to yield during passage of said abutment means beyond said shoulder means and to thereafter bias said abutment means into a position wherein said abutment means engage said shoulder means.

8. In an electrical device as set forth in claim 7 including means on said housing for guiding said elongated member for rectilinear movement in the same direction as said rectilinear movement of said ground pin.

9. In an electrical device as set forth in claim 8 wherein said last-mentioned means is a track.

10. In an electrical device as set forth in claim 6 wherein said cam means comprise a pair of inclined ramp members with one of each of said pair of ramp members on opposite sides of said elongated member.

11. In an electrical device as set forth in claim 10 wherein said elongated member is flexible and resilient for biasing said abutment means toward said housing to thereby permit said abutment means to yield during passage of said abutment means beyond said shoulder means and to thereafter bias said abutment means into a position wherein said abutment means engage said shoulder means.

12. In an electrical device as set forth in claim 11 wherein said abutment means comprise a cross-bar on said elongated member.

13. An electrical device with a retractable ground pin comprising a housing divided longitudinally into first and second housing portions having first and second walls, respectively, support means in said housing for supporting a printed circuit board thereon in spaced relationship to said first wall, prong means mounted on said housing, lead means connecting said circuit board to said prong means, a ground pin having an inner end and having an outer end for movement between retracted and extended positions relative to said housing, means in said second housing portion for rectilinearly guiding said ground pin for movement between extended and retracted positions relative to said housing, an elongated member in said second housing portion, first and second ends on said elongated member, means securing said first end of said elongated member to said inner end of said ground pin, interengaging means for selectively connecting said elongated member to said second wall to fixedly secure said ground pin in said extended position, and manually actuatable means secured to said elongated member and extending through said second wall to the outside thereof for effecting movement of said elongated member and said ground pin secured thereto in a rectilinear direction to said extended position wherein said interengaging means fixedly secure said ground pin in said extended position and for disengaging said interengaging means to effect movement of said elongated member and said ground pin connected thereto to said retracted position.

14. An electrical device as set forth in claim 13 wherein said printed circuit board has first and second sides, electrical components mounted on said first side, and wherein said support means mount said one circuit board with said first side in spaced relationship to said first wall to thereby provide a space within said housing to accommodate said electrical components.

15. An electrical device as set forth in claim 14 wherein said support means comprise means on at least one of said first and second housing portions for restricting movement of said circuit board toward and away from said first and second walls, and means on one of said housing portions for restricting movement of said circuit board within the plane in which it is located.

16. An electrical device as set forth in claim 14 wherein said circuit board includes a printed circuit on said second side, a protective cover sheet overlying said second side and spaced from said second wall, and movable elongated second lead means located between said protective cover and said second wall for connecting said circuit board to said ground pin, said protective cover being located between said second side and said second lead means whereby said protective cover protects said second lead means from abrasion by said second side of said circuit board, and said second lead means being sufficiently long to accommodate movement of said ground pin between said extended and retracted positions.

17. An electrical device as set forth in claim 16 wherein said support means comprise means on both said first and second halves for restricting movement of said circuit board relative to said first and second walls, and means on said first half for restricting movement of said circuit board within the plane in which it is located.

18. An electrical device comprising a housing having first and second spaced walls, a printed circuit board, means mounting said printed circuit board in said housing relative to said first side to define a space therebetween, prong means mounted on said housing and extending outwardly therefrom for insertion into an electrical outlet, means electrically coupling said prong means to said circuit board, a ground pin, means mounting said ground pin in said space for movement between an extended position for insertion into said electrical outlet with said prong means and a retracted position wherein it is not inserted into said electrical outlet with said prong means, an elongated lead having end portions and a central portion, said end portions of said elongated lead being attached to said circuit board and said ground pin and said central portion lying in said space, said elongated lead being of a sufficient length so as to maintain said coupling relationship between said circuit board and said ground pin in both said retracted and extended positions of said ground pin, and shield means located between said circuit board and said elongated lead means to shield said central portion of said elongated lead means from engaging said printed circuit board.

19. An electrical device as set forth in claim 18 wherein said mounting means also mount said circuit board in said housing relative to said second side to define a second space therebetween, first and second opposite board sides on said printed circuit board with said first board side facing said first side and with said second board side facing said second side, a printed circuit on said first board side, and electrical components on said second board side extending into said second space.

* * * * *

UNITED STATES PATENT AND TRADEMARK OFFICE
CERTIFICATE OF CORRECTION

PATENT NO. : 4,878,852

DATED : November 7, 1989

INVENTOR(S) : Jack E. Bertsch and Harold P. Kopp

It is certified that error appears in the above-identified patent and that said Letters Patent is hereby corrected as shown below:

Column 6, line 2 (claim 1), change "extracted" to --retracted--.

Signed and Sealed this

Twelfth Day of November, 1991

Attest:

HARRY F. MANBECK, JR.

*Attesting Officer*      *Commissioner of Patents and Trademarks*